United States Patent
Takekawa et al.

(10) Patent No.: US 7,336,107 B2
(45) Date of Patent: Feb. 26, 2008

(54) COMPARATOR CIRCUIT AND CONTROL METHOD THEREOF

(75) Inventors: Koji Takekawa, Kasugai (JP); Takahiro Watai, Kasugai (JP); Masaya Mizutani, Kasugai (JP); Takuya Okajima, Kasugia (JP)

(73) Assignee: Fujitsu Limited, Kawasaki (JP)

( * ) Notice: Subject to any disclaimer, the term of this patent is extended or adjusted under 35 U.S.C. 154(b) by 139 days.

(21) Appl. No.: 11/398,702

(22) Filed: Apr. 6, 2006

(65) Prior Publication Data
US 2007/0146015 A1     Jun. 28, 2007

(30) Foreign Application Priority Data
Dec. 26, 2005    (JP)   ................ 2005-373175

(51) Int. Cl.
*H03K 5/22*     (2006.01)
(52) U.S. Cl. .............. 327/77; 327/63; 327/50
(58) Field of Classification Search ........... 327/50–56, 327/63, 64, 77, 78, 83
See application file for complete search history.

(56) References Cited

U.S. PATENT DOCUMENTS

| | | | | |
|---|---|---|---|---|
| 4,926,068 A * | 5/1990 | Fujita | .......... | 327/72 |
| 5,666,075 A * | 9/1997 | Schinzel | .......... | 327/77 |
| 5,894,234 A * | 4/1999 | Morris | .......... | 327/65 |
| 5,945,852 A * | 8/1999 | Kosiec | .......... | 327/68 |
| 6,208,187 B1 * | 3/2001 | Callahan, Jr. | .......... | 327/206 |
| 6,316,978 B1 * | 11/2001 | Shacter | .......... | 327/205 |
| 6,605,964 B2 * | 8/2003 | Nakada | .......... | 327/65 |
| 6,693,466 B2 * | 2/2004 | Inoue et al. | .......... | 327/72 |
| 6,867,623 B2 * | 3/2005 | Nishizono | .......... | 327/78 |

FOREIGN PATENT DOCUMENTS

| | | |
|---|---|---|
| JP | 60-186764 A | 9/1985 |
| JP | 2001-34366 A | 2/2001 |

* cited by examiner

*Primary Examiner*—N. Drew Richards
*Assistant Examiner*—Hai L. Nguyen
(74) *Attorney, Agent, or Firm*—Arent Fox LLP

(57) ABSTRACT

This invention provides a comparator circuit which outputs a stable waveform without oscillation even if a gradient of a change of a comparison input signal is small and determines a magnitude of the comparison input signal within a predetermined threshold value regardless of the increase/decrease direction of the comparison input signal. A comparator circuit 100 comprises a capacitative element 4 which is charged or discharged corresponding to a difference of potential between a comparison input signal IN and a reference input signal REF, an analog buffer portion 5 which outputs high level if the voltage is above a threshold voltage Vth and low level if it is less than the threshold voltage Vth, an edge detecting portion 7 which detects leading and trailing edges of the analog buffer portion 5 so as to output an up signal UP and a down signal DOWN and a charge pump portion 8 which charges a capacitative portion corresponding to the up signal UP and discharges the capacitative portion corresponding to the down signal DOWN.

19 Claims, 16 Drawing Sheets

BLOCK DIAGRAM SHOWING STRUCTURE OF COMPARATOR CIRCUIT OF FIRST EMBODIMENT

FIG. 1 PRINCIPLE DIAGRAM OF COMPARATOR CIRCUIT OF PRESENT INVENTION

FIG. 2 BLOCK DIAGRAM SHOWING STRUCTURE OF COMPARATOR CIRCUIT OF FIRST EMBODIMENT

CIRCUIT DIAGRAM SHOWING AN EXAMPLE OF COMPARISON PORTION

CIRCUIT DIAGRAM SHOWING AN EXAMPLE OF CONSTANT CURRENT GENERATING PORTION

CIRCUIT DIAGRAM SHOWING AN EXAMPLE OF ANALOG BUFFER PORTION

CIRCUIT DIAGRAM SHOWING ANOTHER EXAMPLE OF ANALOG BUFFER PORTION

CIRCUIT DIAGRAM SHOWING AN EXAMPLE OF DELAY OUTPUT PORTION AND EDGE DETECTION PORTION

CIRCUIT DIAGRAM SHOWING AN EXAMPLE OF CHARGE PUMP PORTION

FIG. 9 TIMING CHART SHOWING OPERATION OF COMPARATOR CIRCUIT OF EMBODIMENT

ENLARGED DIAGRAM OF PORTION YY' IN TIMING CHART OF FIG. 9

BLOCK DIAGRAM SHOWING STRUCTURE OF COMPARATOR CIRCUIT OF SECOND EMBODIMENT

CIRCUIT DIAGRAM SHOWING AN EXAMPLE OF SWITCH PORTION

CIRCUIT DIAGRAM SHOWING ANOTHER EXAMPLE OF DELAY OUTPUT PORTION

BLOCK DIAGRAM SHOWING STRUCTURE OF COMPARATOR CIRCUIT OF THIRD EMBODIMENT

CIRCUIT DIAGRAM SHOWING AN EXAMPLE OF COMPARISON OUTPUT SIGNAL AMPLIFYING PORTION

BLOCK DIAGRAM SHOWING STRUCTURE OF CIRCUIT FOR CORRECTING AN ANALOG CIRCUIT

COMPARATOR CIRCUIT AND CONTROL METHOD THEREOF

CROSS-REFERENCE TO RELATED APPLICATIONS

This application is based upon and claims the benefit of priority from each of the prior Japanese Patent Application No. 2005-373175 filed on Dec. 26, 2005, the entire contents of which are incorporated herein by reference.

BACKGROUND OF THE INVENTION

1. Field of the Invention

The present invention relates to a comparator circuit and more particularly to a comparator circuit, which determines the magnitudes of voltage levels of a comparison input signal increasing or decreasing monotonously and a reference input signal.

2. Description of the Related Art

As an example of a characteristic correction circuit for correcting the characteristic of an analog circuit depending on an external factor such as temperature, a primary characteristic correction circuit, which uses two primary coefficients intersecting in a threshold value, can be mentioned. A characteristic correction circuit 110 shown in FIG. 16 comprises a comparator circuit 100 which compares a comparison input signal IN which is a temperature detection value with a reference input signal REF set preliminarily, a coefficient selective operating portion 113 which selects one of a first correction coefficient 111 and a second correction coefficient 112 depending on a comparison result of the comparator circuit 100 and computes its correction value and a correction portion 114 for correcting the characteristic of an analog circuit 120 depending on the correction value. Upon correction of the characteristic of the analog circuit 120, the respective correction coefficients 111, 112 are switched by the comparator circuit 100 when the voltage level of the comparison input signal IN and the voltage level of the reference input signal REF meet each other.

This characteristic correction circuit 110 often corrects the characteristic corresponding to a slowly changing phenomenon such as the surrounding environment and temperature in the circuit. The comparator circuit 100 of the characteristic correction circuit 110 which corrects for the temperature amplifies a fine detection output such as noise and outputs an oscillation waveform because the comparison input signal IN changes slowly in the vicinity of the threshold. If the oscillation waveform is outputted from the comparator circuit 100, the coefficient selective operation portion 113 and the correction portion 114 cannot follow up such a quick change so that they cannot correct the characteristic properly. Thus, there is a problem in that an abnormal voltage may be outputted from the analog circuit.

To solve such a problem, the comparator circuit 100 having hysteresis characteristic is sometimes used in order to suppress an output of the oscillation waveform in the comparator circuit 100 in the vicinity of the threshold. The comparator circuit 100 having the hysteresis characteristic has different thresholds between a case where a detection value as an external factor changes upward and a case where it changes downward. As a consequence, the comparator circuit 100 becomes unlikely to be affected by fine voltage changes such as noise, so as to suppress an output of the oscillation waveform of the comparator circuit 100.

As regards the comparator circuit 100, related arts have been disclosed in Japanese Unexamined Patent Publication No.60 (1985)-186764 and Japanese Unexamined Patent Publication No. 2001-34366.

SUMMARY OF THE INVENTION

However, if the comparator circuit 100 having hysteresis characteristic is used in the characteristic correction circuit 110, the threshold for switching the correction coefficients 111 and 112 changes depending on the direction of increase or decrease of the comparison input signal. That is, at least in any of a case where a detection value which is an external factor changes upward and a case where it changes downward, there is a problem in that the change of the correction coefficient becomes discontinuous thereby finally inducing distortion of the output characteristic of the analog circuit.

The present invention has been accomplished in view of the above-described problem of the background art and intends to provide a comparator circuit which outputs a stable waveform without oscillation even if the gradient of a change of a comparison input signal is small and determines the magnitude of the comparison input signal within a predetermined threshold regardless of the increase/decrease direction of the comparison input signal.

In order to achieve the object, there is provided a comparator circuit comprising:

a comparison portion for comparing input signals with each other;

an integrating portion for integrating corresponding to an output signal from the comparison portion;

a threshold detecting portion that detects that an integration value from the integrating portion exceeds a preliminarily set threshold and a change direction of the integration value; and an integration accelerating portion that increases/decreases the integration value in the same direction as the change direction corresponding to a result of detecting that the integration value in the threshold detecting portion exceeds the threshold.

In addition to the above, there is provided a control method of a comparator circuit comprising:

a step of comparing input signals with each other;

a step of integrating corresponding to a result of the step of comparing;

a step of detecting that an integration value from the integrating step exceeds a preliminarily set threshold and a change direction of the integration value; and a step of increasing/decreasing the integration value in the same direction as the change direction corresponding to a result of detecting that the integration value in the threshold detecting portion exceeds the threshold.

According to a comparator circuit and a control method of the present invention, in an integrating portion which integrates corresponding to an output signal of a comparison portion, an integration value is increased or decreased in a direction of intensifying a gradient of an increase/decrease of the integration value by an integration accelerating portion. Thus, the change of the integration value after input signals to be compared coincide becomes steep so that an output changes quickly before an oscillation waveform is generated. In any case of when an input signal increases or decreases, a threshold becomes equal when an output is inverted. Therefore, there can be provided a comparator circuit in which generation of the oscillation waveform is prevented and the threshold when the output is inverted is equal regardless of the direction of increase or decrease of the input signal. That is, the comparator circuit of the present invention can prevent oscillation even if the comparison portion is provided with no hysteresis characteristic.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
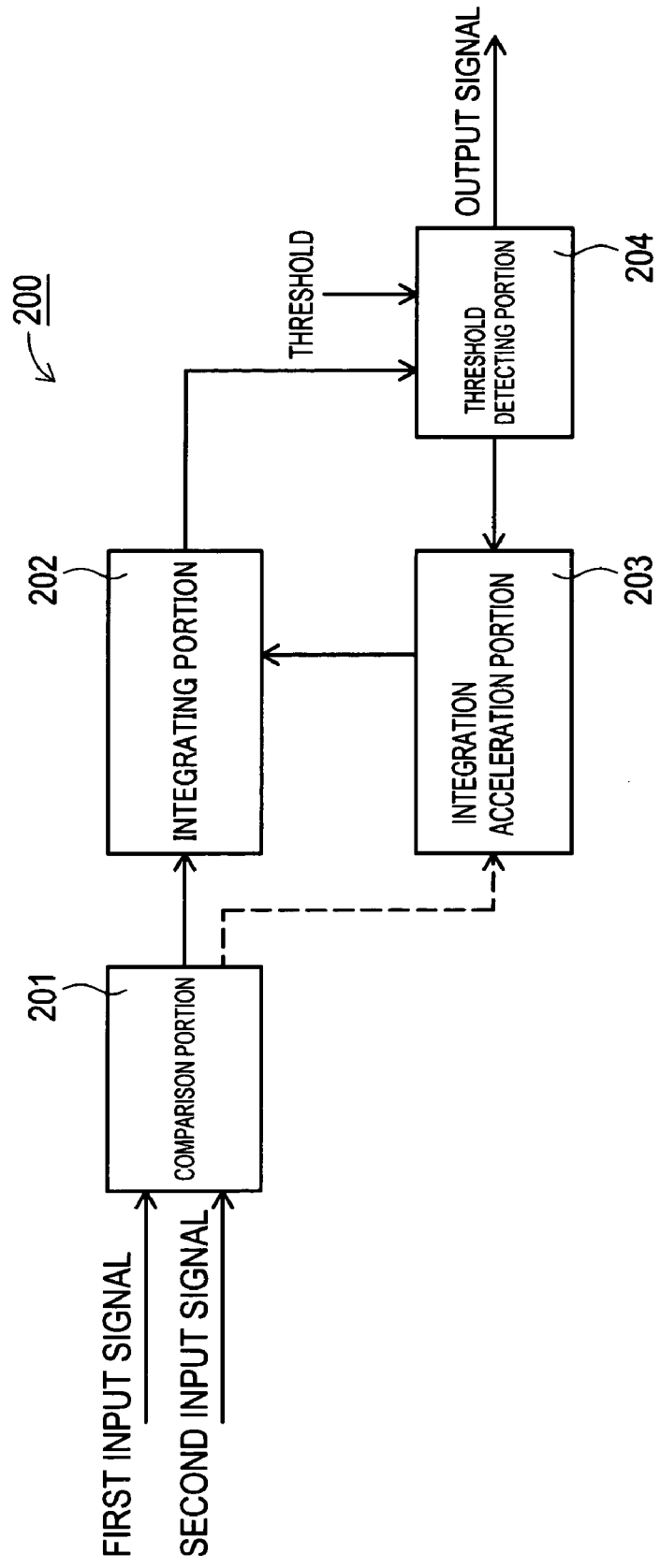
FIG. 1 is a principle diagram of a comparator circuit of the present invention.

FIG. 1 is a principle diagram showing a principle of a comparator circuit of the present invention. The comparator circuit 200 comprises a comparison portion 201, an integrating portion 202, a threshold detecting portion 204 and an integration accelerating portion 203.

The comparison portion 201 compares voltage levels of a first input signal and a second input signal, and outputs an output signal corresponding to a difference. The integrating portion 202 integrates corresponding to an output signal of the comparison portion 201 and outputs its integration value. The threshold detecting portion 204 detects that this integration value exceeds a preliminarily set threshold and outputs an output signal corresponding to that detection. The threshold detecting portion 204 detects a change direction of the integration value (increase direction or decrease direction) and outputs its detection result to the integration accelerating portion 203. The integration acceleration portion 203 increases or decreases the integration value in the same direction as a change direction of the integration value corresponding to a result of detection that the integration value of the threshold detecting portion 204 exceeds the threshold.

Because the integration value becomes steep after it exceeds the threshold, the output is inverted quickly before the oscillation waveform is generated. In any case where an input signal increases relative to the other input signal, the threshold becomes equal when the output is inverted. Therefore, the comparator circuit 200 prevents generation of the oscillation waveform and further, has the same threshold when the output is inverted regardless of the increase/decrease directions of the input signal. That is, the comparator circuit 200 of the present invention can prevent oscillation even if the comparison portion 201 is provided with no hysteresis characteristic.

The comparison portion 201 may be of any type if it can compare the input signals or may be of a type which compares voltage levels as described above or of a type which compares a current value or a phase difference. Although in the above description, an example in which the comparison portion 201 compares the two input signals (first and second input signals), it may be of a type which compares a plurality of input signals (for example, first, second and third input signals).

The integrating portion 202 may be of any type if it can integrate corresponding to an output of the comparison portion 201 and for example, a capacitative element. In this case, the comparison portion 201 generates a current for charging/discharging the integrating portion 202.

The integration accelerating portion 203 may be of any type if it can increase or decrease the integration value in the same direction as the change direction of the integration value corresponding to a detection result of the threshold detecting portion 204 and for example, may be a charge pump if the integrating portion 202 is constituted of a capacitative element or may be means which increases or decreases the quantity of accumulated charges by controlling the current value variably with an output current of the comparison portion 201 as an input as shown with a dotted line in FIG. 1.

Although in the above description, a case where the integrating portion 202, the integration accelerating portion 203 and the threshold detecting portion 204 are constituted of hardware each has been explained, the present invention can be applied if these are realized with software. More specifically, the present invention can be applied to a case where with the output value from the comparison portion 201 expressed with output digital value, the integrating portion 202 is constituted of a register which adds or subtracts the output digital value, the threshold detecting portion 204 is constituted of comparison operation with the threshold and detection operation in a change direction of the output digital value and the integration accelerating portion 203 is constituted of an operation of adding or subtracting the output of the threshold detecting portion 204 with respect to the integration value.

Hereinafter, the embodiment of the comparator circuit of the present invention will be described in detail with reference to FIGS. 2-15.

Figure 16:
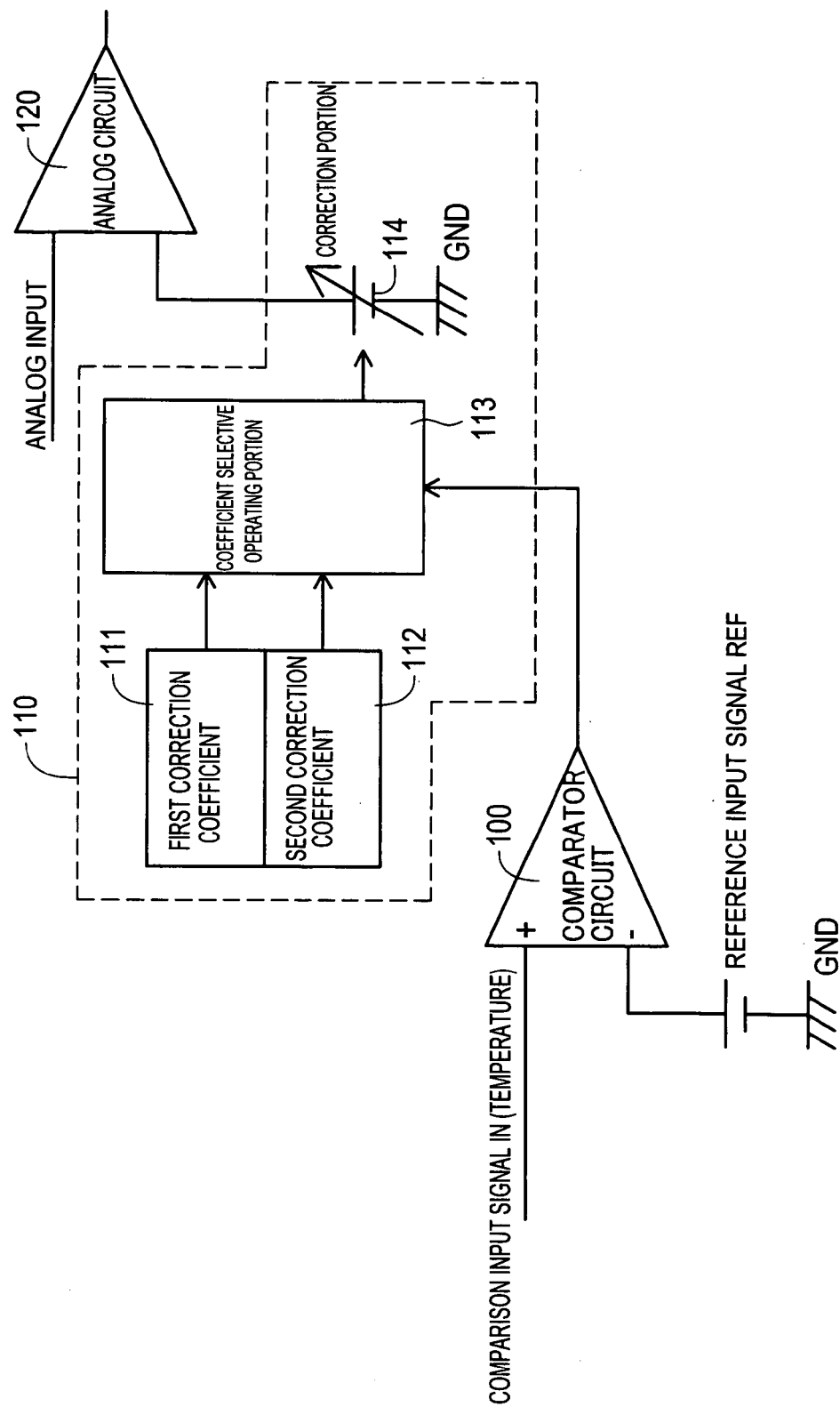
FIG. 16 is a block diagram showing a structure of a circuit for correcting an analog circuit.

The comparator circuit 100 is connected to an input of a correction circuit 110 of FIG. 16. In the comparator circuit 100, the reference input signal REF set preliminarily is inputted to its inverting terminal and the comparison input signal IN as a temperature detection signal is inputted to a non-inverting terminal.

Figure 2:
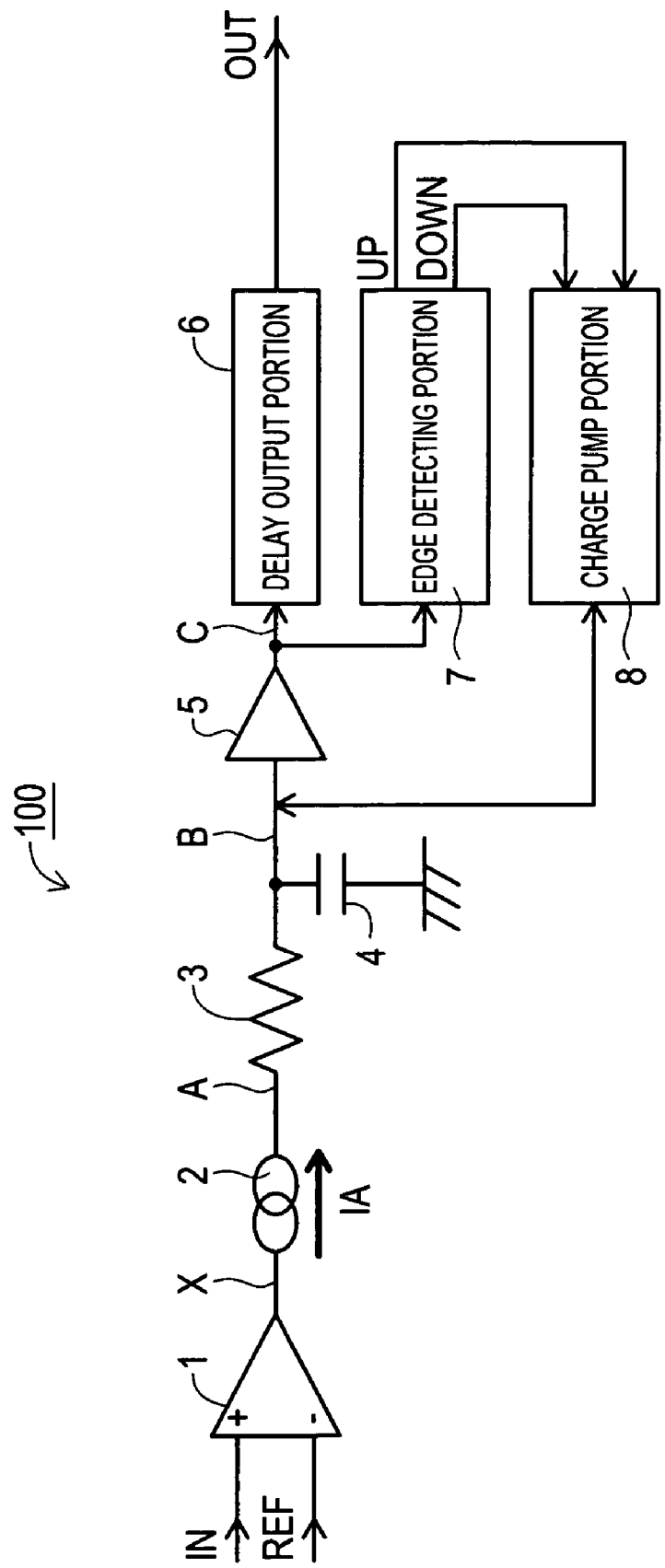
FIG. 2 is a block diagram showing a structure of the comparator circuit of a first embodiment.

FIG. 2 is a block diagram showing the structure of the comparator circuit 100 of the first embodiment. The comparator circuit 100 comprises a comparison portion 1, a constant current generating portion 2, a resistor element 3, a capacitative element 4, an analog buffer portion 5, a delay output portion 6, an edge detecting portion 7 and a charge pump portion 8.

The comparison portion 1 receives the comparison input signal IN and the reference input signal REF, and outputs its comparison result to a detection signal X. The constant current generating portion 2 receives the detection signal X and outputs a constant current in a direction corresponding to the detection signal X to a first intermediate point A. The capacitative element 4 is charged or discharged from the constant current generating portion 2 through the resistor element 3 and electric charge is charged or discharged from the charge pump portion 8 also. The analog buffer portion 5 outputs a digital output signal C to the delay output portion 6 and the edge detection portion 7 corresponding to a potential at a second intermediate point B. The edge detecting portion 7 detects a leading edge and a trailing edge of the digital output signal C and outputs an up signal UP and a down signal DOWN to the charge pump 8 corresponding to its detection result.

Figure 3:
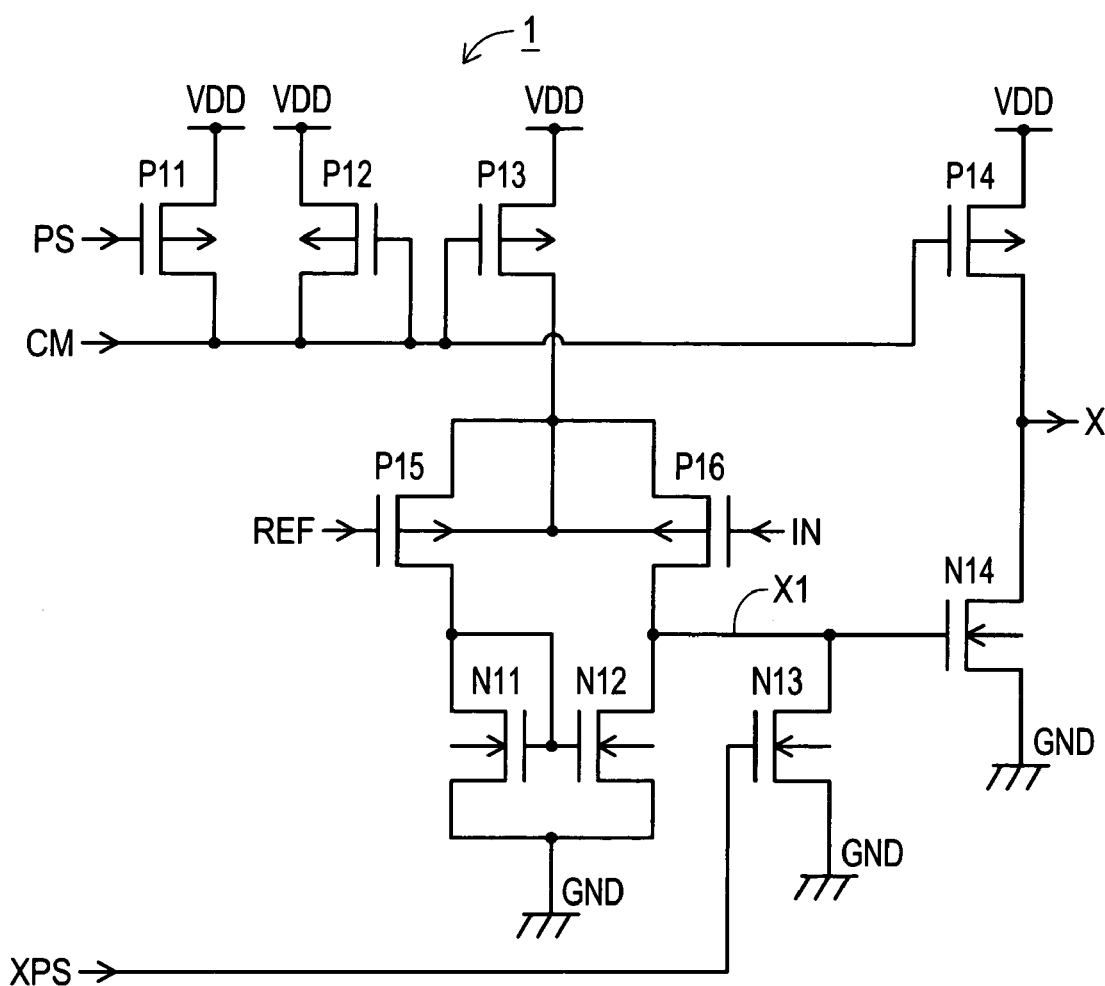
FIG. 3 is a circuit diagram showing an example of a comparison portion.

FIG. 3 is a circuit diagram showing a specific example of the comparison portion 1. In the comparison portion 1, the comparison input signal IN is inputted to its non-inverting terminal and the reference input signal REF is inputted to the inverting terminal. The detection signal X is outputted corresponding to a difference in potential between the reference input signal REF and the comparison input signal IN. Additionally, bias signal CM as well as power supply signals PS, XP are inputted. The power supply signals PS, XP are signals for controlling the output of the comparison portion 1. Here, the power supply signal XPS is a logical inversion signal which changes with the power supply signal PS. When the power supply signal PS (XPS) is high level (low level), the detection signal X of the comparison portion 1 is validated and when it is low level (high level), the detection signal X of the comparison portion 1 turns to high impedance. The bias signal CM is connected to a constant current source (not shown) and the bias current is supplied to the comparison portion 1.

The comparison portion 1 includes P type MOS transistors P11-P16 and N type MOS transistors N11-N14.

The P type MOS transistor P11 and the N type MOS transistor N13 are transistors for controlling the detection signal X corresponding to the power supply signals PS, XPS. The P type MOS transistors P12, P13 are transistors for supplying a bias current to a current mirror type differential amplifier described later corresponding to the bias signal CM. The P type MOS transistor P14 and the N type MOS transistor N14 are transistors which execute output buffer operation.

The P type MOS transistors P15, P16 and the N type MOS transistors N11, N12 constitute a current mirror type differential amplifier, generating a potential corresponding to the comparison input signal IN and the reference input signal REF at the intermediate point X1. That is, when it is actuated in a saturation area, if the potential of the reference input signal REF << the potential of the comparison input signal IN, the intermediate point X1 turns to low level and if the potential of the reference input signal REF >> the potential of the comparison input signal IN, the intermediate point X1 turns to high level. Further, the potential of the intermediate point X1 is applied to the gate of the N type MOS transistor N14. Thus, if the potential of the reference input signal REF << potential of the comparison input signal IN, the detection signal X turns to high level and if the potential of the reference input signal REF >> the potential of the comparison input signal IN, the detection signal X turns to low level.

If the difference of potential between the reference input signal REF and the comparison input signal IN is small and it is actuated in a linear area, a level corresponding to the difference of potential between the reference input signal REF and the comparison input signal IN is outputted to the detection signal X.

Figure 4:
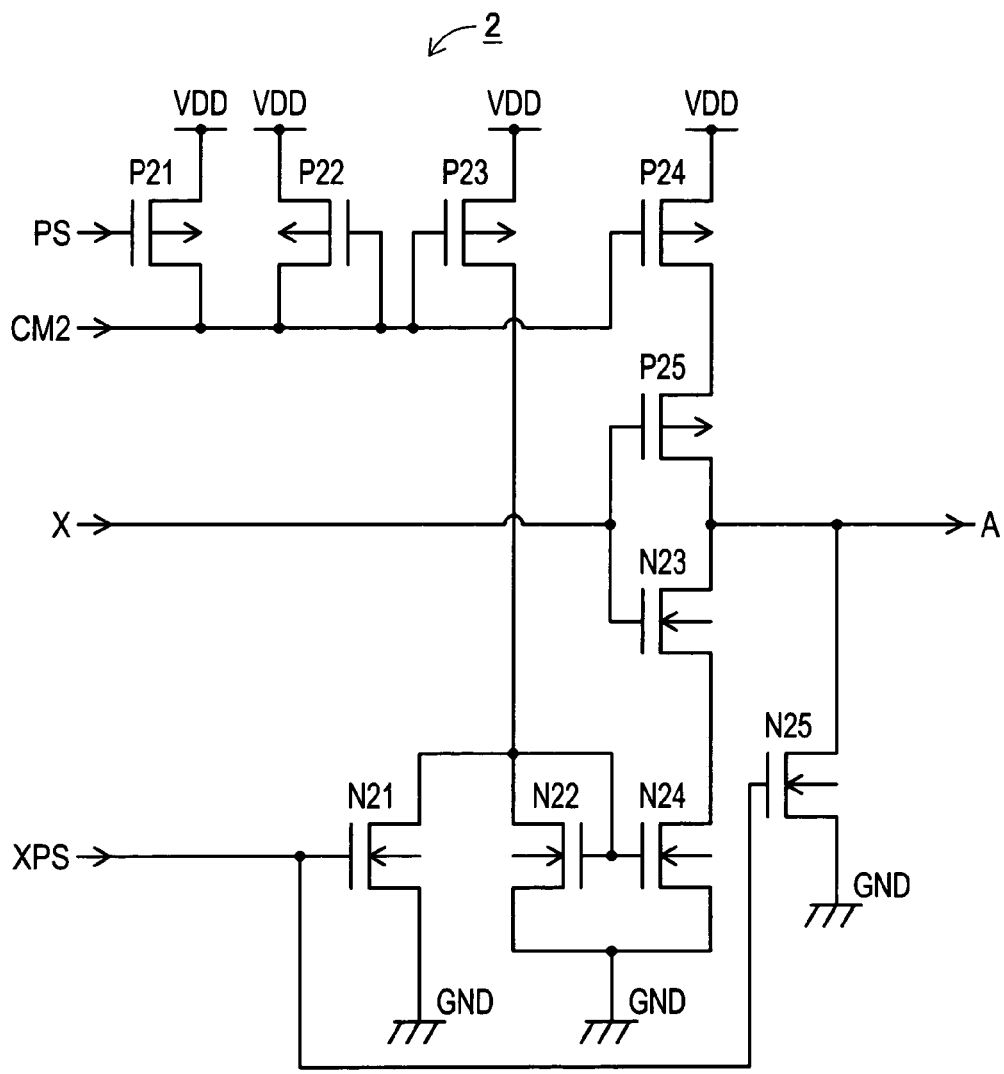
FIG. 4 is a circuit diagram showing an example of a constant current generating portion.

FIG. 4 is a circuit diagram showing a specific example of the constant current generating portion 2. In the constant current generating portion 2, a constant current in a direction corresponding to the detection signal X from the comparison portion 1 is outputted from the first intermediate point A. The constant current generating portion 2 includes P type MOS transistors P21-P25 and N type MOS transistors N21-N25.

The P type MOS transistor P21 and the N type MOS transistors N21, N25 are transistors for controlling the first intermediate point A corresponding to the power supply signals PS, XPS. The P type MOS transistor P22 is a transistor for supplying bias current to the current mirror type constant current circuit described later corresponding to the bias signal CM2. Further, the P type MOS transistor P25 and the N type MOS transistor N23 are transistors for controlling the output of current.

The P type MOS transistors P22-P24 and the N type transistors N22, N24 constitute the current mirror type constant current circuit. If the P type MOS transistor 25 conducts electricity, because the current mirror is constituted of the P type MOS transistors P22, P24, current flowing through these are equalized. Further, if the N type MOS transistor N23 conducts electricity, because the current mirror is constituted of the N type MOS transistors N22, N24, currents flowing through these are equalized. Further because the P type MOS transistor P23 and the N type MOS transistor N22 are connected in series, current flowing through these are equalized. Therefore, if the detection signal X is low level, charging current flows to the capacitative element 4 through the P type MOS transistors P24, P25 and if the detection signal X is high level, discharging current having the same current value as the charging current flows from the capacitative element 4 through the N type MOS transistors N23, N24. That is, in the constant current generating portion 2, charging and discharging are switched under the same current value corresponding to the detection signal X of the comparison portion 1.

Figure 5:
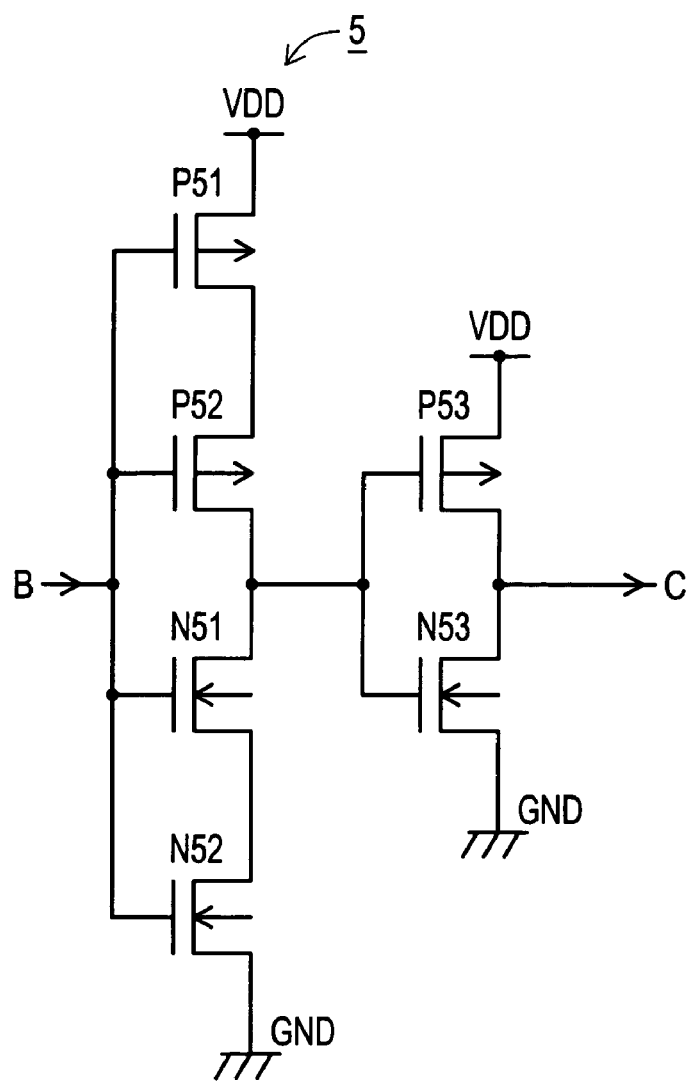
FIG. 5 is a circuit diagram showing an example of an analog buffer portion.

FIG. 5 is a circuit diagram showing a specific example of the analog buffer portion 5. The analog buffer portion 5 receives an analog voltage at the second intermediate point B and outputs high level or low level to the digital output signal C having a threshold voltage as boundary.

The analog buffer portion 5 includes P type MOS transistors P51-P53 and N type MOS transistors N51-N53. The P type MOS transistors P51, P52 and the N type MOS transistors N51, N52 constitute an inverter. Because this inverter is constituted of two stages of the P type and N type transistor, it has a smaller inductance than in a case where it is constituted of a single stage. Consequently, the magnitude of current flowing through when the potential of the second intermediate point B is in the vicinity of the threshold can be suppressed, thereby achieving reduction in power consumption.

Figure 6:
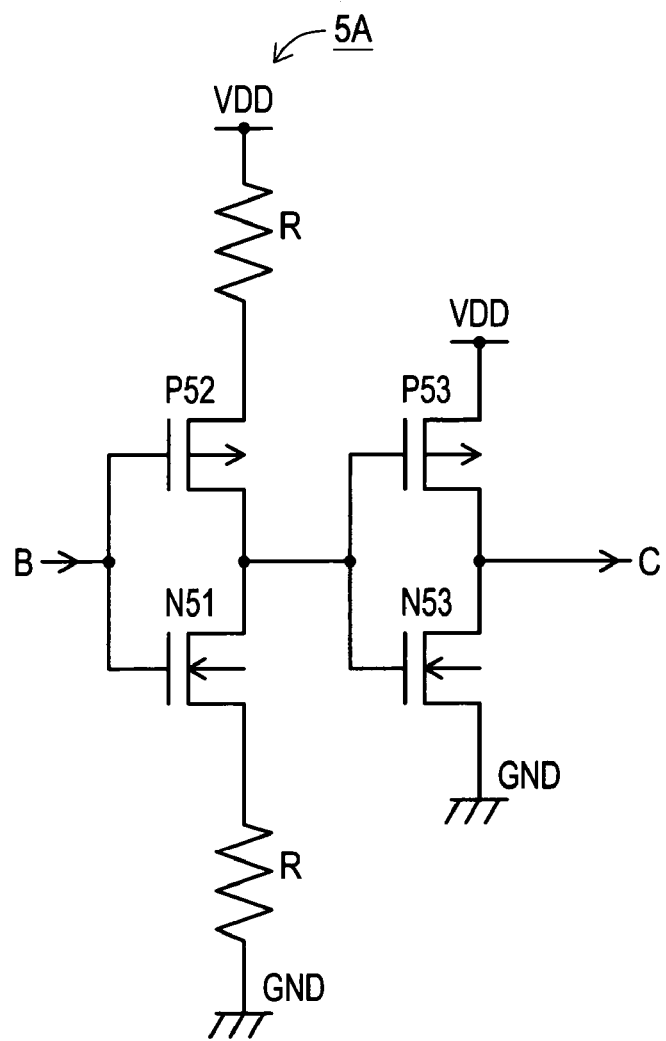
FIG. 6 is a circuit diagram showing another example of the analog buffer portion.

The analog buffer portion 5 may be constructed as an analog buffer portion 5A as shown in FIG. 6. The analog buffer portion 5A has a resistance R instead of the P type MOS transistor P51 and the N type MOS transistor N52. The magnitude of current flowing through when the potential of the second intermediate point B is in the vicinity of the threshold can be suppressed by this resistor element R like the analog buffer portion 5 thereby achieving reduction in consumption power.

Figure 7:
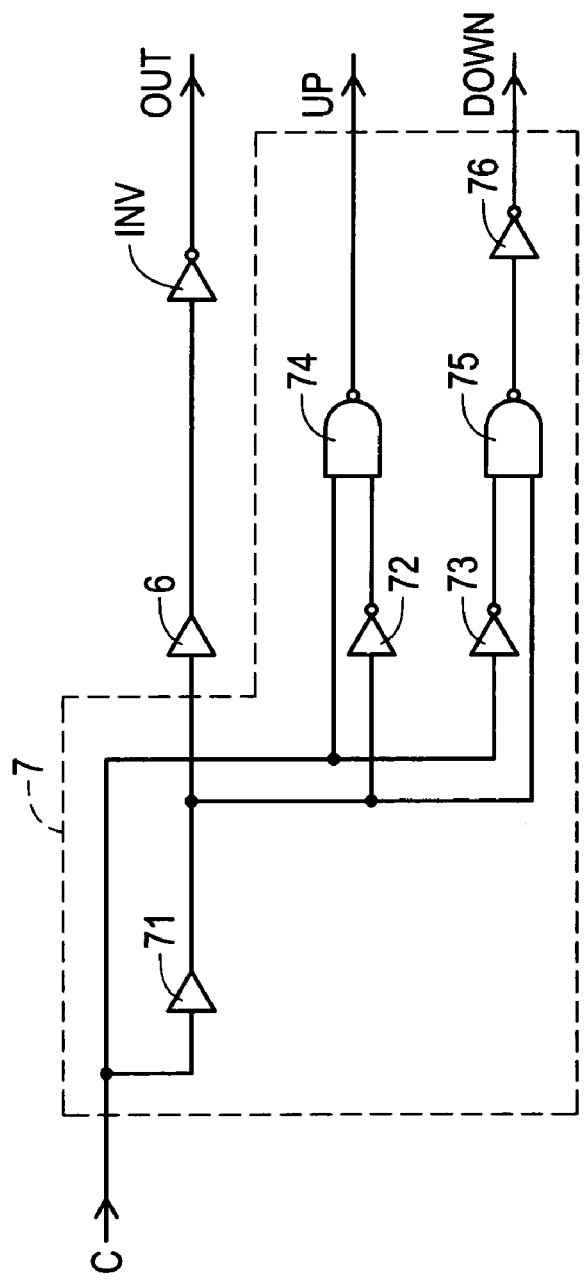
FIG. 7 is a circuit diagram showing an example of a delay output portion and an edge detection portion.

FIG. 7 is a circuit diagram showing a specific example of the delay output portion 6 and the edge detecting portion 7. The edge detecting portion 7 outputs an up signal UP having a predetermined width if the digital output signal C is received and a leading edge is detected and outputs a down signal DOWN having a predetermined width if it a trailing edge is detected. After the up signal UP and down signal DOWN are rendered inactive, the delay output portion 6 outputs an output signal OUT with a delay by a delay time td1.

The edge detecting portion 7 includes a delay element 71, inverters 72, 73, 76 and NAND gates 74, 75.

The digital output signal C is inputted to one input of the NAND gate 74 and the digital output signal C is inputted to the other input of the delay element 71 and the inverter 72. When the digital output signal C is changed from low level to high level, the other input of the NAND gate 74 which is at high level initially, is changed to low level after a delay time td2 of the delay element 71. Therefore, the NAND gate 74 outputs low level pulse having the delay time td2 to the up signal UP from the leading edge of the digital output signal C.

The digital output signal C is inputted to one input of the NAND gate 75 through the inverter 73 and the digital output signal C is inputted to the other input through the delay element 71. When the digital output signal C is changed from high level to low level, the other input of the NAND gate 75 which is at high level initially is changed to low level after the delay time td2 of the delay element 71. Therefore, the NAND gate 75 outputs low level pulse having the delay time td2 from the trailing edge of the digital output signal C. This low level pulse is inverted through the inverter 76 and the inverted high level pulse is outputted to the down signal DOWN.

Figure 8:
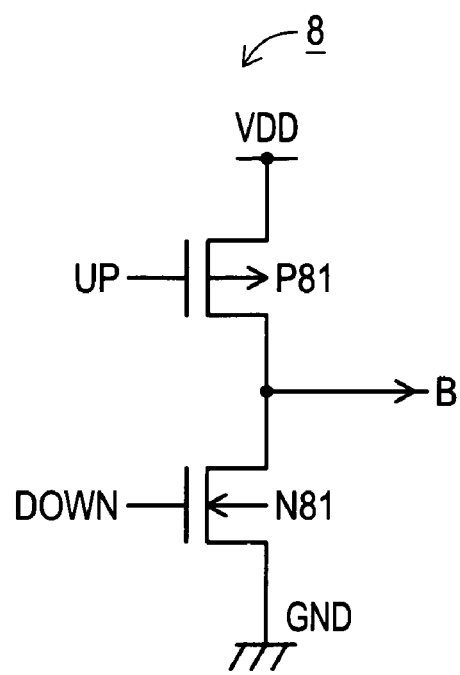
FIG. 8 is a circuit diagram showing an example of a charge pump portion.

FIG. 8 is a circuit diagram showing a specific example of the charge pump portion 8. When the up signal UP turns to low level in the charge pump portion 8, current flows from a power source potential VDD to the second intermediate point B and when the down signal DOWN turns to high level, current flows from the second intermediate point B to the grounding potential GND. Because the up signal UP and down signal DOWN are pulses which are activated with a width of the delay time td2, the comparator circuit 100 of the first embodiment can control the quantity of current flow-in and flow-out accurately by adjusting the delay time td2.

The operation of the comparator circuit 100 of the first embodiment will be described with reference to FIGS. 9 and 10.

Figure 9:
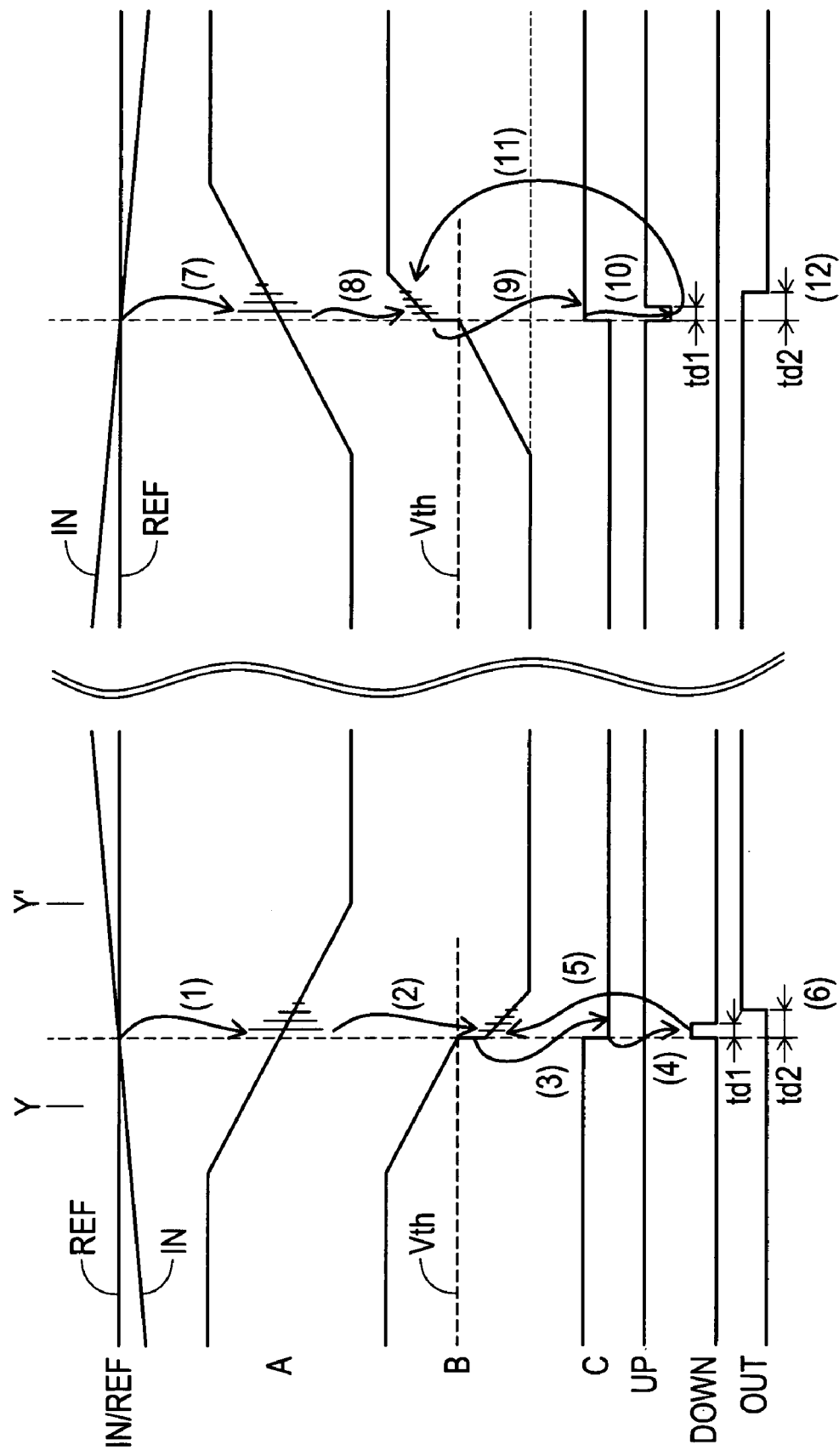
FIG. 9 is a timing chart showing an operation of the comparator circuit of the embodiment.
Figure 10:
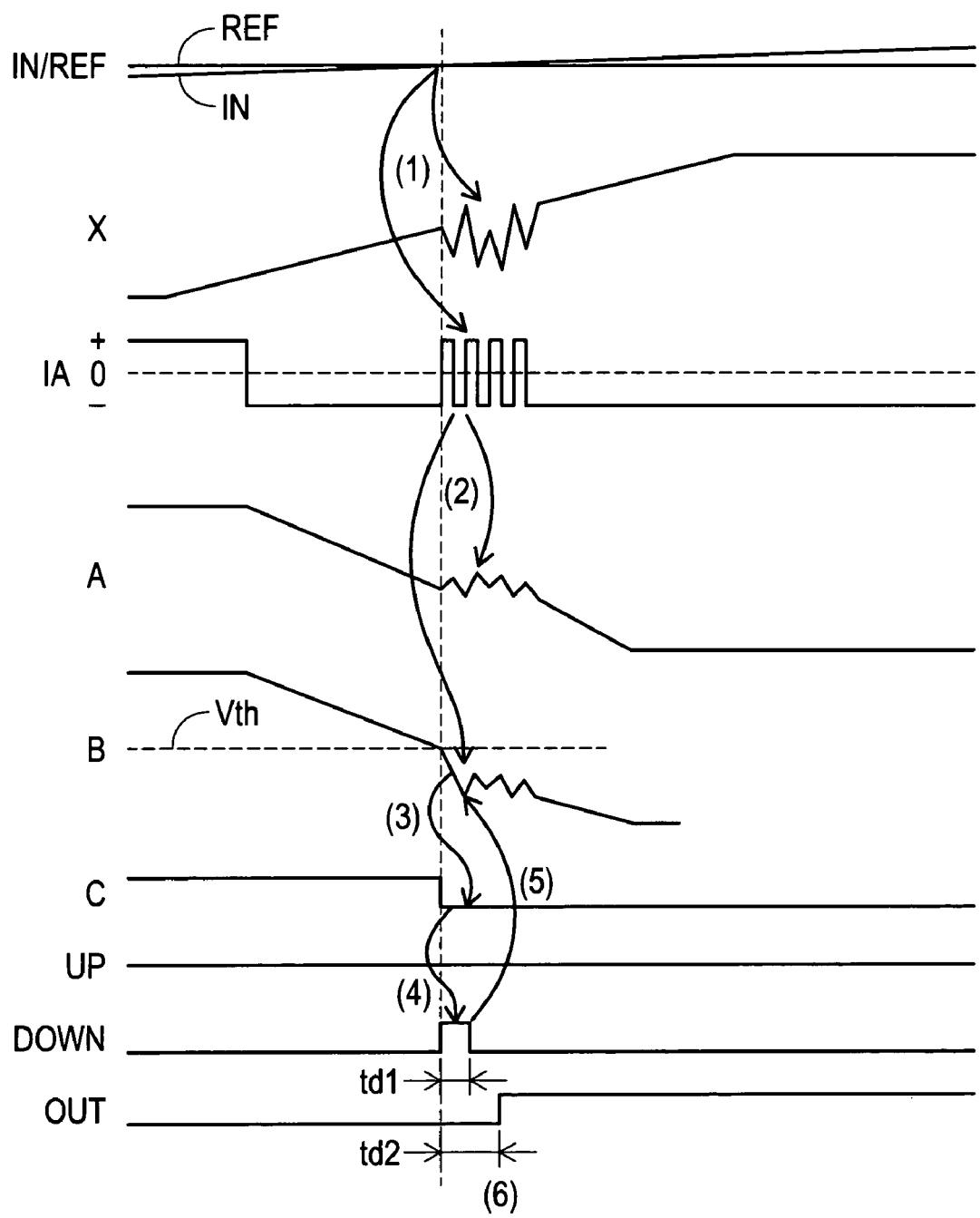
FIG. 10 is an enlarged diagram of a portion YY' in the timing chart of FIG. 9.

FIG. 9 is a timing chart showing the operation of the comparator circuit 100 and FIG. 10 is an enlarged diagram of a portion YY'.

The left half of FIG. 9 indicates a timing of a case where the comparison input signal IN rises in the right direction. Because the comparison input signal IN rises gradually from the low level and the detection signal X which is an output of the comparison portion 1 begins to rise (FIG. 10) and further, the capacitative element 4 is discharged by constant current IA which flows in an opposite direction from the constant current generating portion 2, the potentials at the first intermediate point A and the second intermediate point B begin to fall.

If the potentials of the reference input signal REF and the comparison input signal IN become substantially equal in (1), an oscillation waveform is outputted to the detection signal X due to an influence of noise.

The direction of flow of the constant current IA changes alternatively depending on the oscillation waveform of the detection signal X in (2) and further, the oscillation waveform is outputted to the first intermediate point A.

If the potential of the analog buffer portion 5 drops below the threshold voltage Vth in (3), the output of the digital output signal C changes to low level.

The edge detecting portion 7 detects the trailing edge of the digital output signal C in (4) and then outputs a high level pulse having a pulse width of the delay time td1 to the down signal DOWN.

The charge pump 8 discharges electric charges to the second intermediate point B in (5). As a consequence, the potential of the second intermediate point B drops quickly. Because current used for charging is converted to specified constant current IA by the constant current generating portion 2 and that specified constant current IA is restricted by the resistor element 3, the potential of the second intermediate point B is determined by the operation of discharge by the charge pump portion 8. Thus, even if the direction of flow of the constant current IA changes alternately, the potential of the second intermediate point B never rises above the threshold voltage Vth of the analog buffer portion 5. As a consequence, no oscillation waveform is propagated to the digital output signal C.

It delays with the delay time td2 from the trailing edge of the digital output signal C and high level is outputted to the output signal OUT.

The right half of FIG. 9 shows a timing of a case where the comparison input signal IN falls in the right direction. If the comparison input signal falls gradually from high level, the potentials at the first intermediate point A and the second intermediate point B begin to rise.

If the potentials of the reference input signal REF and the comparison input signal IN become substantially equal in (7), the oscillation waveform is outputted to the detection signal X due to an influence of noise.

The direction of flow of the constant current IA changes alternately corresponding to the oscillation waveform of the detection signal X in (8) and further, the oscillation waveform is outputted to the first intermediate point A.

If the potential of the second intermediate point B rises above the threshold voltage Vth of the analog buffer portion 5 in (9), the output of the digital output signal C changes to high level.

The edge detecting portion 7 detects a leading edge of the digital output signal C in (10) and outputs a low level pulse having a pulse width of a delay time td1 to the up signal UP.

The charge pump portion 8 charges electric charges to the second intermediate point B in (11). As a consequence, the potential of the second intermediate point B rises quickly. Because current used for charging is converted to specified the constant current IA by the constant current generating portion 2 and that constant current IA is restricted by the resistor element 3, the potential of the second intermediate point is determined by the operation of the charge pump 8. Thus, even if the direction of the flow of the constant current IA changes alternately, the potential of the second intermediate point B never drops below the threshold voltage Vth. As a consequence, no oscillation waveform is propagated to the digital output signal C.

It delays by only the delay time td2 from the trailing edge of the digital output signal C in (12) so that high level is outputted to the output signal OUT.

Even if the gradient of a change is small like the comparison input signal IN, the comparator circuit 100 of the first embodiment can output a stable waveform without oscillation.

In the comparator circuit 100, a current value for charging or discharging the capacitative element 4 is limited by the constant current generating portion 2 and the resistor element 3. As a consequence, charging and discharging from the charge pump portion 8 can be carried out securely thereby preventing oscillation of the output signal OUT securely.

Because the comparator circuit 100 of the first embodiment outputs the output signal OUT after charging or discharging to the capacitative element by the charge pump portion 8 is completed, the influence of noise outputted from the analog circuit to the output signal OUT can be reduced.

Figure 11:
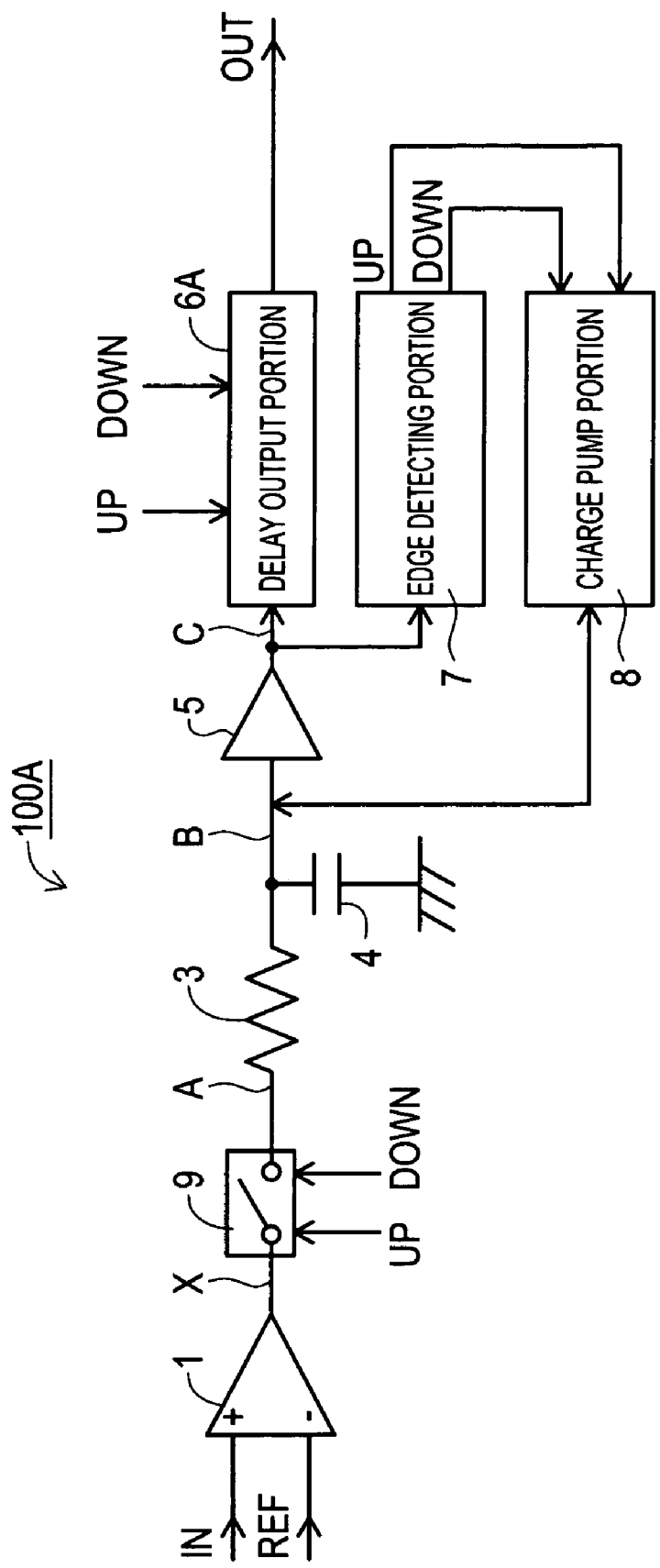
FIG. 11 is a block diagram showing a structure of the comparator circuit of a second embodiment.

Next, a comparator circuit 100A of the second embodiment will be described. FIG. 11 is a block diagram showing the structure of the comparator circuit 100A. The comparator circuit 100A is different from the comparator circuit 100 of the first embodiment only in that it includes a switch portion 9 instead of the constant current generating portion 2 and a delay output portion 6A instead of the delay output portion 6. Therefore, mainly different portions will be explained in a following description and description of the same portion is omitted or simplified.

The switch portion 9 is inserted into between the comparison portion 1 and the resistor element 3 and controls conduction of current in a path from the comparison portion 1 to the capacitative element 4 corresponding to the up signal UP and the down signal DOWN.

Figure 12:
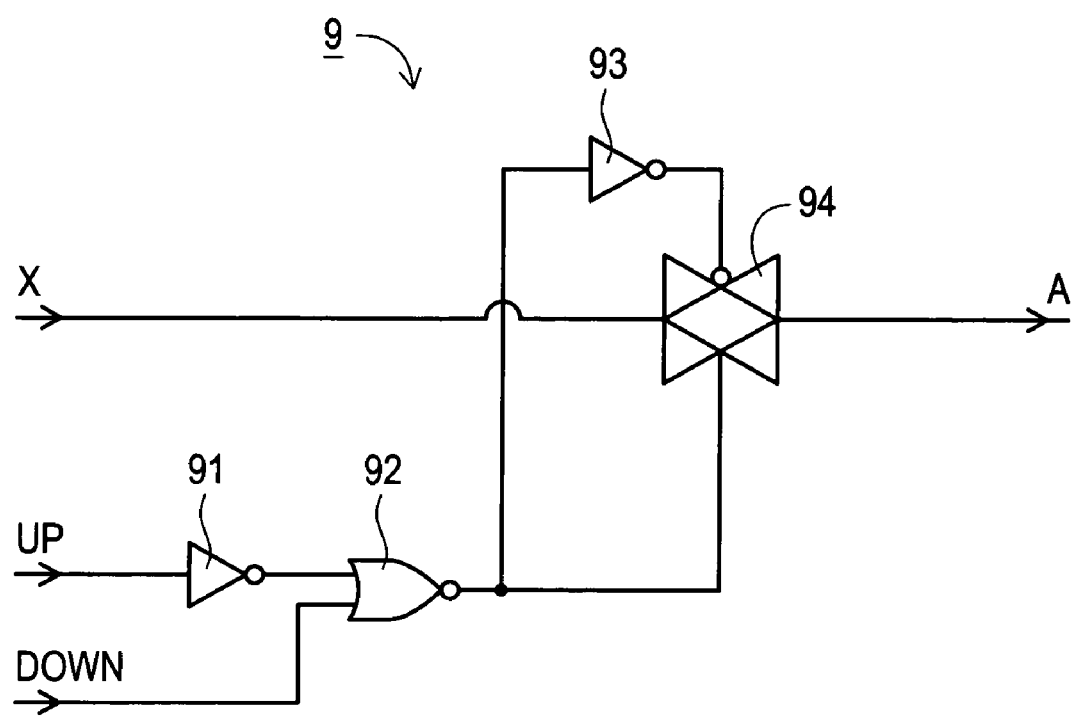
FIG. 12 is a circuit diagram showing an example of a switch portion.

FIG. 12 is a circuit diagram showing a specific example of the switch portion 9. The switch portion 9 includes inverters 91, 93, NOR gate 92 and analog switch 94.

The up signal UP is inputted to one input of the NOR gate 92 through the inverter 91 and the down signal DOWN is inputted to the other input of the NOR gate 92.

The analog switch 94 becomes conductive when the control input terminal and the inverting control input terminal are high level and low level respectively and it is non-conductive when they are low level and high level respectively. An output signal of the NOR gate 92 is inputted to the control input terminal in the analog switch 94 and an output signal of the NOR gate 92 is inputted to the inverting control input terminal through the inverter 93.

If the up signal UP is low level or the down signal DOWN is high level as a result of the above connection, the analog switch 94 is controlled to be non-conductive and in case of other combination of the up signal UP and the down signal DOWN, the analog switch 94 is controlled to be conductive.

When the capacitative element 4 is charged by the charge pump portion 8, the up signal UP changes to the low level and when it is discharged, the down signal DOWN changes to the high level. Therefore, if the capacitative element 4 is charged or discharged by the charge pump 8, the analog switch 94 is controlled to be non-conductive. Because drive current from the comparison portion 1 can be interrupted, the charge pump portion 8 can charge or discharge the capacitative element 4 securely thereby preventing oscillation of the output signal OUT securely.

Next, the delay output portion 6A will be described. The up signal UP and down signal DOWN as well as the digital output signal C are inputted to the delay output portion 6A as shown in FIG. 11.

Figure 13:
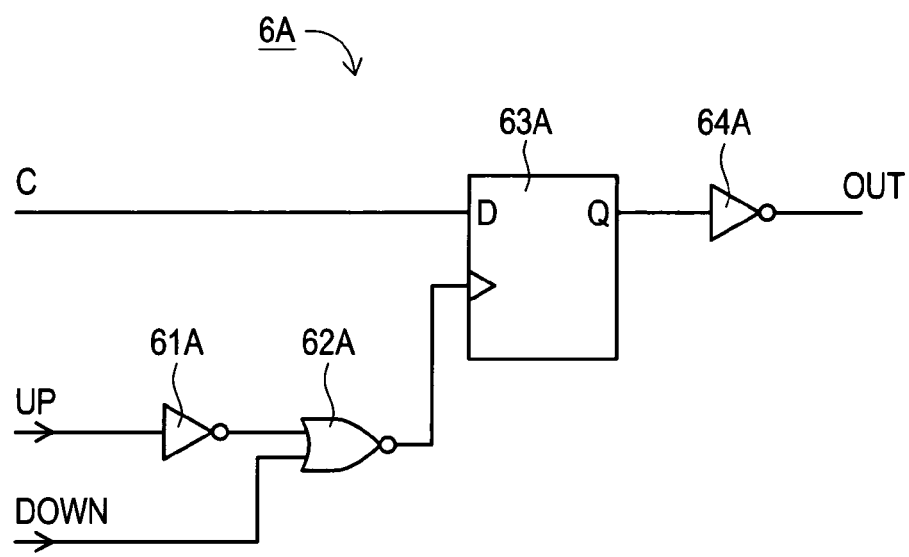
FIG. 13 is a circuit diagram showing another example of a delay output portion.

FIG. 13 is a circuit diagram showing a delay output portion 6A which is another example of the delay output portion 6. The delay output portion 6A includes inverters 61A, 64A, NOR gate 62A and flip-flop 63A.

In the NOR gate 62A, the up signal UP is inputted to one input through the inverter 61A and the down signal DOWN is inputted to the other input. An output of the NOR gate 62A is inputted to a clock terminal (terminal having a symbol ">" in FIG. 13) of the flip-flop 63A. Further, a terminal Q of the flip-flop 63A is inputted to the output signal OUT through the inverter 64A.

When the up signal UP is changed from the low level to the high level or the down signal DOWN is changed from the high level to the low level as a result of the above-described connection, the trailing edge of the clock terminal is inputted to the clock terminal, the digital output signal C connected to the terminal D is held and outputted to the terminal Q and its inversion logic is outputted to the output terminal OUT. The digital output signal C is outputted after the up signal UP or the down signal DOWN changes from activate condition to inactivate condition. Thus, an influence of noise outputted from the analog circuit to the output signal OUT can be reduced.

Figure 14:
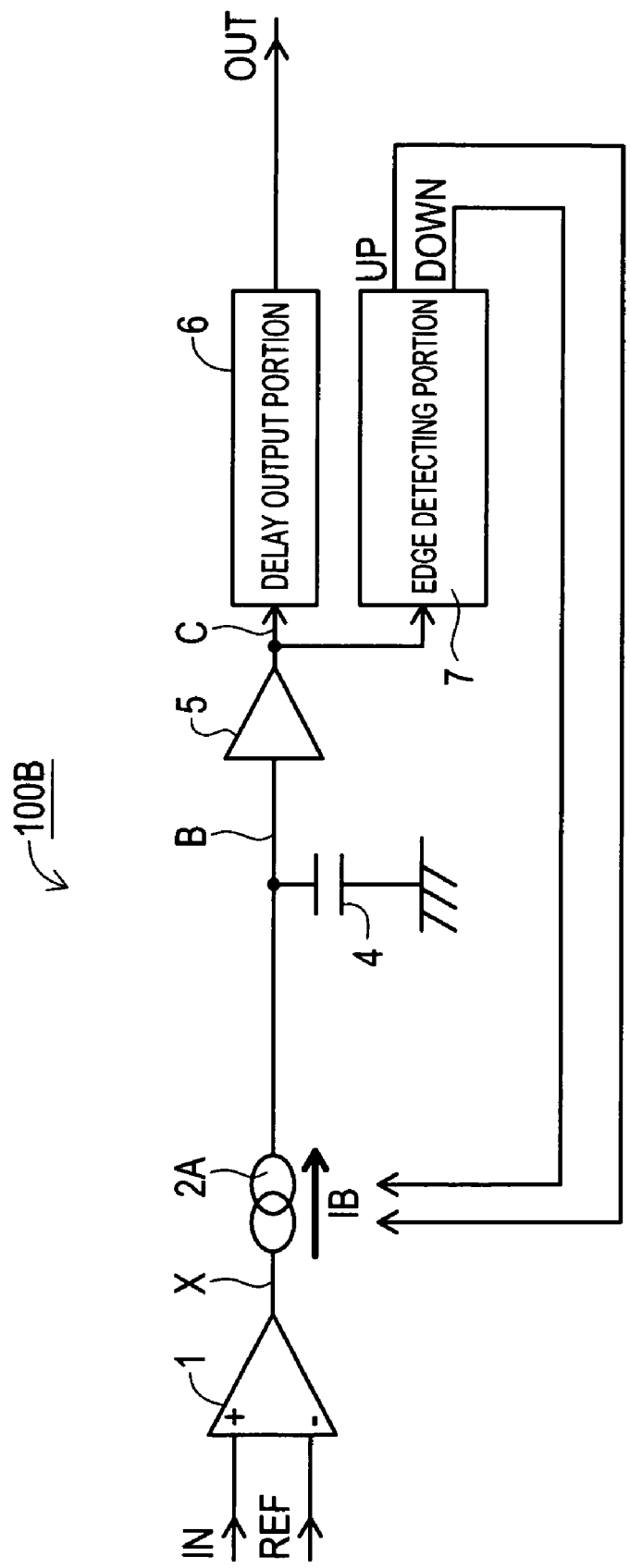
FIG. 14 is a block diagram showing a structure of the comparator circuit of a third embodiment.

Next, a comparator circuit 100B of a third embodiment will be described below. FIG. 14 is a block diagram showing the structure of the comparator circuit 100B. The comparator circuit 100B is different from the comparator circuit 100 of the first embodiment in that the resistor element 3 and the charge pump portion 8 are removed from the comparator 100 and a comparison output signal increasing portion 2A is provided instead of the constant current generating portion 2. Therefore, in a below description, mainly different portions will be explained and description of the same portions is omitted or simplified.

In the comparison output signal increasing portion 2A, a charging/discharging current IB is fluctuated corresponding to the up signal UP and the down signal DOWN from the edge detecting portion 7. More specifically, if the up signal UP changes to low level, the charging/discharging current IB is increased in a positive direction (right direction in FIG. 14) and the down signal DOWN changes to high level, the charging/discharging current IB is increased in a negative direction (left direction in FIG. 14).

Figure 15:
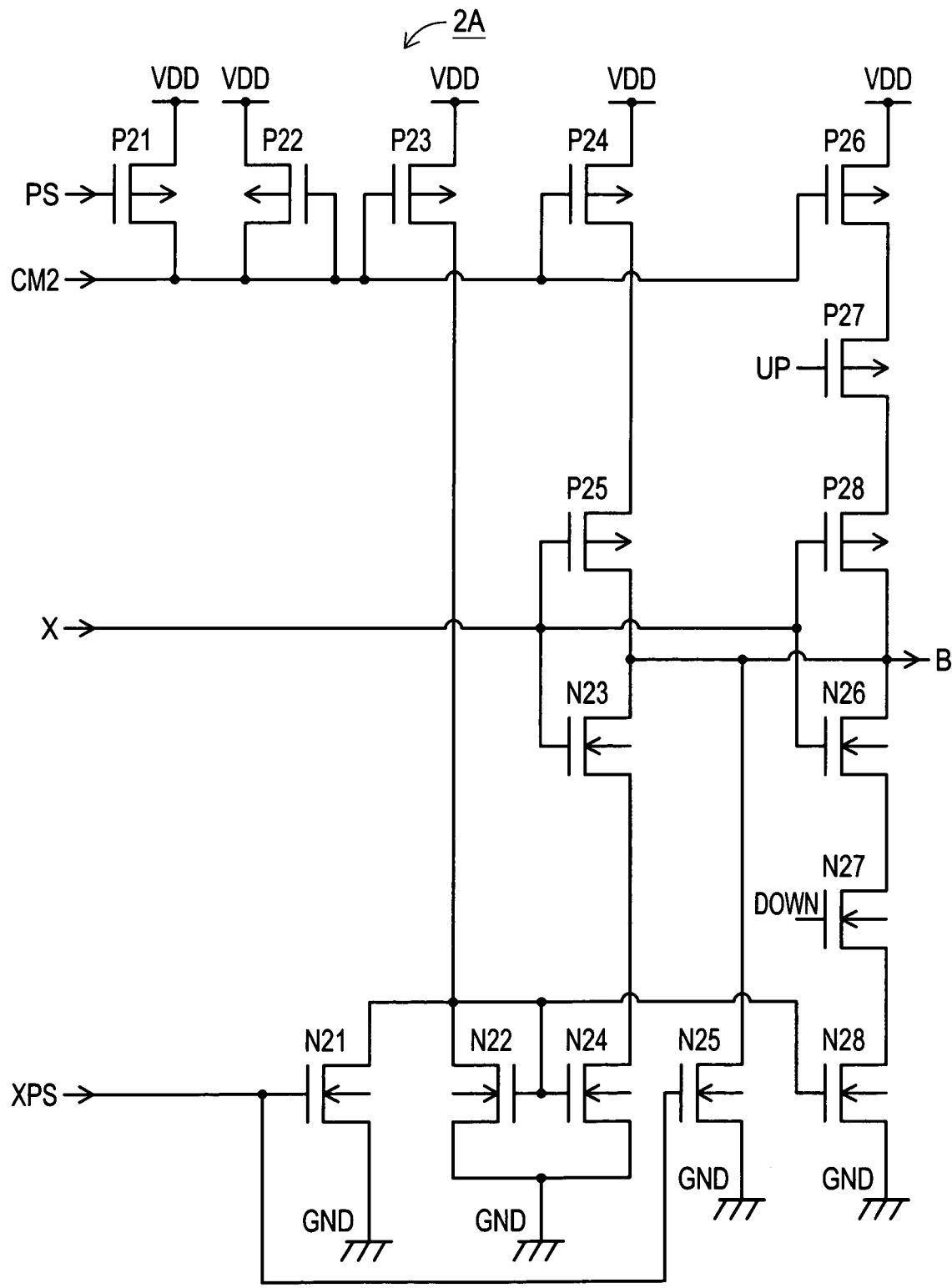
FIG. 15 is a circuit diagram showing an example of a comparison output signal amplifying portion.

FIG. 15 is a circuit diagram showing a specific example of a comparison output signal increasing portion 2A. In the comparison output signal increasing portion 2A, P type MOS transistors P26-P28 and N type MOS transistors N26-N28, which are connected between power source potential VDD and grounding potential GND, are added to the constant current generating portion 2 of the comparator circuit 100.

The P type MOS transistor P28 and the N type transistor N26 function as an inverter whose conduction is controlled corresponding to a detection signal X. The same gate bias as the P type MOS transistor P24 and the N type MOS transistor N22 are applied to the P type MOS transistor P26 and the N type MOS transistor N28. Therefore, if the up signal UP changes to low level when the detection signal X is high level, the capacitative element 4 is charged with twice current value. On the other hand, if the down signal DOWN changes to high level when the detection signal X is low level, the capacitative element 4 is discharged with twice current value.

In the comparator circuit 100B of the third embodiment, the change speed is accelerated in the same direction as a changed direction of the output from the analog buffer 5 corresponding to a detection result from the edge detecting portion 7 like the charge pump 8 of the comparator 100. As a consequence, a change in the integration value becomes steep after the input signals coincide, the output changes quickly before an oscillation waveform is generated. Further, the threshold when the output is inverted is equal both when the input signal increases and decreases. Therefore, this comparator circuit may provide the same threshold when the output is inverted regardless of the direction of increase/decrease of the input signal, preventing generation of the oscillation waveform. That is, the comparator circuit 100B of the present invention can prevent oscillation even if the comparison portion is not provided with hysteresis characteristic.

In the comparator circuit 100, balance of the drive performance of the constant current generating portion 2 and the charge pump portion 8 is lost due to temperature condition or process disparity, so that if for example, constant current generating portion 2>charge pump portion 8, there is a fear that the voltage change of the capacitative element 4 may not be accelerated sufficiently. In the comparator circuit 100B of the third embodiment, the same current value as charging/discharging current value based on the detection signal X is increased by activation of the up signal UP or the down signal DOWN. Thus, the voltage change of the capacitative element 4 can be accelerated stably regardless of the temperature condition or process disparity. As a consequence, there could be provided a comparator circuit capable of preventing oscillation stably.

Needless to say, the present invention is not restricted to the above-described embodiments but may be improved or modified in various ways within a scope not departing from the spirit of the invention.

Although the first and second embodiments indicate an example containing a current restricting portion (constant current generating portion/resistor element and switch portion/resistor element), an example excluding this current restricting portion may be provided by forming the comparison portion in a current output type. The present invention can be applied to such an example. Further, the present invention can be applied in case where the comparison portion is formed in a voltage output type and the current restricting portion includes only a resistor element.

Although in each embodiment, the output logic in the constant current generating portion is inverted and the logic is inverted again in the delay output portion, the present invention can be applied to a case where any logic is not inverted.

Although in each embodiment, an end of the capacitative element is connected to the grounding potential side, it may be connected to the power source potential side.

Although the third embodiment executes charging/discharging with a twice current value with the current ratio of current mirror as 1 to 1, the current ratio may be of any value.

In the meantime, the capacitative element indicates an example of the capacitative portion, the power source potential indicates an example of the first potential, the grounding potential indicates an example of the second potential, the up signal UP indicates an example of the first edge signal, the down signal DOWN indicates an example of the second edge signal, the constant current generating portion and the resistor element indicate an example of the current restricting portion and the switch portion and the resistor element indicate an example of the current restricting portion.

Further, the P type MOS transistor P25 and N type MOS transistor are an example of the output inverter portion, the P type MOS transistor P24 is an example of the first PMOS transistor, the N type MOS transistor N24 is an example of the second NMOS transistor, the P type MOS transistor P22 is an example of the bias generating portion, the P type MOS transistor P23 is an example of the third PMOS transistor and the N type MOS transistor N22 is an example of the fourth NMOS transistor.

By applying the present invention, it is possible to provide a comparator circuit which outputs a stable waveform without oscillation even if the gradient of the change of the comparison input signal is small and determines the magnitudes of the comparison input signals by comparing with a predetermined threshold regardless of the direction of increase/decrease of the comparison input signal.

What is claimed is:

1. A comparator circuit comprising:
a comparison portion for comparing input signals with each other;
an integrating portion for integrating corresponding to an output signal from the comparison portion;
a threshold detecting portion that detects that an integration value from the integrating portion exceeds a preliminarily set threshold and a change direction of the integration value; and
an integration accelerating portion that increases/decreases the integration value in the same direction as the change direction corresponding to a result of detecting that the integration value in the threshold detecting portion exceeds the threshold.

2. The comparator circuit of claim 1, wherein
the integrating portion includes a capacitative portion that is charged/discharged corresponding to the output signal of the comparison portion, and wherein
the integration accelerating portion includes a charge pump portion for charging/discharging the capacitative portion corresponding to an output of the threshold detecting portion.

3. The comparator circuit of claim 2, wherein
the threshold detecting portion includes an analog buffer portion that outputs a first potential when the voltage of the capacitative portion is above a threshold voltage and outputs a second potential when it is less than the threshold voltage and an edge detecting portion that outputs a first edge signal when the output of the analog buffer portion changes from the second potential to the first potential and outputs a second edge signal when it changes from the first potential to the second potential, and wherein
the charge pump portion charges the capacitative portion corresponding to the first edge signal and discharges the capacitative portion corresponding to the second edge signal.

4. The comparator circuit of claim 1, wherein
the integrating portion includes the capacitative portion that is charged/discharged corresponding to the output signal of the comparison portion, and wherein
the integration accelerating portion includes a comparison output increasing portion that increases the signal strength of the output signal of the comparison portion corresponding to an output of the threshold detecting portion.

5. The comparator circuit of claim 4, wherein
the threshold detecting portion includes: an analog buffer portion that outputs a first potential when the voltage of the capacitative portion is above a threshold voltage and outputs a second potential when it is less than the threshold voltage; and an edge detecting portion that outputs a first edge signal when the output of the analog buffer portion changes from the second potential to the first potential and outputs a second edge signal when it changes from the first potential to the second potential, and wherein the comparison output signal increasing portion includes: a first current generating portion that generates a first charge current or a first discharge current which are currents for charging/discharging the capacitative portion corresponding to the output signal from the comparison portion; a second current generating portion that is connected to an output of the first current generating portion so as to generate a charge current having a magnitude based on the first charge current; and a third current generating portion that is connected to the output of the first current generating portion so as to generate a discharge current having a magnitude based on the first discharge current.

6. The comparator circuit of claim 1, wherein the integrating portion includes a capacitative portion that is charged/discharged corresponding to the output signal of the comparison portion, the comparator further comprising:
a current restricting portion that is provided between the comparison portion and the capacitative portion so as to restrict charge/discharge current to the capacitative portion.

7. The comparator circuit of claim 6, wherein the current restricting portion includes a constant current generating portion which is switched to charge or discharge corresponding to the output signal of the comparator portion.

8. The comparator circuit of claim 7, wherein the constant current generating portion includes: an output inverter portion that receives the output signal of the comparison portion as an input; a first PMOS transistor that is provided between a power source potential and a power source potential input of the output inverter portion; a second NMOS transistor that is provided between a grounding potential and a grounding potential input of the output inverter portion and a bias generating portion for outputting a predetermined bias voltage to a gate of the first PMOS transistor; and a third PMOS transistor and a fourth NMOS transistor provided in series between the power source potential and the grounding potential, wherein
the predetermined bias voltage is applied to a gate of the third PMOS transistor, and wherein
the potential at a connection point between the third PMOS transistor and the fourth NMOS transistor is applied to gates of the second NMOS transistor and the fourth NMOS transistor.

9. The comparator circuit of claim 6, wherein the current restricting portion includes a resistor element provided between the comparison portion and the capacitative portion.

10. The comparator circuit of claim 6, wherein the current restricting portion is provided between the comparison portion and the capacitative portion, the comparator portion further comprising:
a switch portion that is controlled to be non-conductive when the charge pump portion charges or discharges the capacitative portion.

11. The comparator portion of claim 1, wherein the threshold detecting portion includes an inverter whose input is connected to the integrating portion and the inverter includes a passing-through current restricting portion that is provided on a path leading from the power source potential to the grounding potential through the inverter so as to restrict a current passing through.

12. The comparator circuit of claim 11, wherein the passing-through current restricting portion includes the P type MOS transistor and/or N type MOS transistor whose gate is connected to an input of the inverter.

13. The comparator circuit of claim 11, wherein the passing-through current restricting portion includes a resistor element.

14. The comparator circuit of claim 1, further comprising:
a delay output portion that delays an output thereof at least only by an activation period of the output in the threshold detecting portion.

15. The comparator circuit of claim 14, wherein the delay output portion includes a flip-flop that updates an output of the analog buffer portion when the first or second edge signal changes to non-activation condition.

16. The comparator circuit of claim 1, wherein the output of the threshold detecting portion is a pulse signal having a predetermined width in the activation period.

17. A control method of a comparator circuit comprising:
a step of comparing input signals with each other;
a step of integrating corresponding to a result of the step of comparing;
a step of detecting that an integration value from the integrating step exceeds a preliminarily set threshold and a change direction of the integration value; and
a step of increasing/decreasing the integration value in the same direction as the change direction corresponding to a result of detecting that the integration value in the threshold detecting portion exceeds the threshold.

18. The control method of the comparator circuit of claim 17, wherein
the step of integrating is a step of charging/discharging the capacity corresponding to a result of the step of comparing, and wherein
the step of increasing/decreasing the integration value is a step of charging/discharging the capacitative portion corresponding to detecting that the integration value exceeds the threshold.

19. The control method of the comparator circuit of claim 17, wherein
the step of integrating is a step of charging/discharging capacity corresponding to a result of the comparing step, and wherein
the step of increasing/decreasing the integration value increases the signal strength of the comparing step corresponding to detecting that the integration value exceeds the threshold.

* * * * *